United States Patent
Zhou et al.

(10) Patent No.: US 8,625,078 B2
(45) Date of Patent: Jan. 7, 2014

(54) ILLUMINATION DESIGN FOR LENS HEATING MITIGATION

(75) Inventors: Jianming Zhou, Boise, ID (US); Scott Light, Boise, ID (US); Dan Millward, Boise, ID (US); Yuan He, Boise, ID (US); Kaveri Jain, Boise, ID (US); Lijing Gou, Boise, ID (US); Zishu Zhang, Boise, ID (US); Anton DeVilliers, Boise, ID (US); Michael Hyatt, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 223 days.

(21) Appl. No.: 13/080,666

(22) Filed: Apr. 6, 2011

(65) Prior Publication Data

US 2012/0257177 A1 Oct. 11, 2012

(51) Int. Cl.
*G03B 27/32* (2006.01)
*G03B 27/52* (2006.01)

(52) U.S. Cl.
USPC .................................. 355/77; 355/30; 355/55

(58) Field of Classification Search
USPC .................. 355/52, 53, 55, 67–71, 30, 77
See application file for complete search history.

(56) References Cited

U.S. PATENT DOCUMENTS

| | | | |
|---|---|---|---|
| 5,888,675 A * | 3/1999 | Moore et al. ...................... 430/5 |
| 6,788,383 B1 * | 9/2004 | Jeunink et al. .................. 355/30 |
| 7,817,249 B2 * | 10/2010 | Uehara ............................ 355/70 |
| 8,134,683 B2 * | 3/2012 | Van Der Laan et al. ........ 355/53 |
| 2008/0192217 A1 | 8/2008 | Laan | |

* cited by examiner

*Primary Examiner* — Hung Henry Nguyen
(74) *Attorney, Agent, or Firm* — Winston Hsu; Scott Margo

(57) ABSTRACT

A method for reducing the effects of lens heating of a lens in an imaging process includes determining heat load locations on the lens according to an illumination source and a reticle design, obtaining a lens response characterization according to the heat load locations, and utilizing the heat load locations and the lens response characterization to generate a lens heating sensitivity map.

6 Claims, 4 Drawing Sheets under illumination. Lens aberrations can then be described, such as by using Zernike polynomials. The embodiments thus vary the illumination source to try to minimize the effect of the lens heating.

ILLUMINATION DESIGN FOR LENS HEATING MITIGATION

BACKGROUND OF THE INVENTION

1. Field of the Invention

This present application relates to lens imaging, and more particularly, to a system for lens imaging that mitigates the effects of lens heating. The systems and methods described herein mitigate the heat signature without substantially affecting the imaging performance.

2. Description of the Prior Art

Lithographic projection is a technique whereby light (usually from a laser) is projected through a photo mask into a pupil lens, and then projected via the lens onto a wafer. This technique is used, for example, to print integrated circuits (ICs). The photo mask and the specific illumination mode used (for example, a dipole illumination mode) mean that certain parts of the lens may absorb more heat than others. Over time, the effect of the heating may increase. The net result is a non-uniform temperature distribution across the lens. Wavefront aberrations and lens distortion may occur as a result. When the shape of the lens is distorted, the projected light onto the wafer may be influenced. Therefore, lens heating can significantly affect the quality of imaging.

When determining how temperature affects a lens, certain factors may be taken into consideration. Certain areas of the lens may be more sensitive to heat than others, and therefore the aberrations may be greater. In addition, it might not be sufficient to only consider the effect of heating on the pupil (determined by the numerical aperture, NA). Although light outside the pupil might not be projected onto the wafer, it might still contribute to the lens heating, by causing wavefront aberrations.

One method of characterizing how temperature affects a lens is by using a set of Zernike polynomials. Zernike polynomials are linearly independent terms that describe, up to the $n^{th}$ order, aberrations across the lens. If the lens heating effect is known, designers can compensate by adjusting various optical elements to substantially cancel out the effects; however, it is not known how to fully correct for these aberrations. Correcting for one Zernike term may induce other aberrations. Also, some correction methods are limited to certain ranges.

SUMMARY OF THE INVENTION

The embodiments described herein thus provide a number of methods that reduce and potentially cancel out the negative effects of the lens heating without substantially affecting the imaging quality.

A method for reducing the effects of lens heating of a lens in an imaging process according to a first embodiment comprises: determining heat load locations on the lens according to an illumination source and a reticle design; obtaining a lens response characterization according to the heat load locations; utilizing the heat load locations and the lens response characterization to generate a lens heating sensitivity map; and utilizing the lens heating sensitivity map to place at least an extra pole in a specific location of the lens, wherein the extra pole generates a diffraction pattern configured to reduce the lens heating effect. The extra pole may be a phantom pole located outside a pupil-stop area of the lens.

A method for reducing the effects of lens heating of a lens in an imaging process according to a second embodiment comprises: determining heat load locations on the lens according to an illumination source and a reticle design; obtaining a lens response characterization according to the heat load locations; utilizing the heat load locations and the lens response characterization to generate a lens heating sensitivity map; and utilizing the lens heating sensitivity map to alter the shape of the illumination source so that diffraction patterns generated by the illumination source fall outside sensitive areas of the pupil as indicated by the lens heating sensitivity map.

A method for reducing the effects of lens heating of a lens in an imaging process according to a third embodiment comprises: determining heat load locations on the lens according to an illumination source and a reticle design; obtaining a lens response characterization according to the heat load locations; utilizing the heat load locations and the lens response characterization to generate a lens heating sensitivity map; and utilizing the lens heating sensitivity map to place at least an extra pole in a specific location of the pupil, wherein the extra pole generates a diffraction pattern configured to reduce the lens heating effect. The extra pole may be located inside a pupil-stop area of the lens.

A method for optimizing image performance of a lens used in an imaging procedure according to a fourth embodiment comprises: selecting a source mask to be used in the imaging procedure; determining heat load locations on the lens according to an illumination source and a reticle design; obtaining a lens response characterization according to the heat load locations; utilizing the heat load locations and the lens response characterization to generate a lens heating sensitivity map; determining an imaging and lens heating performance according to the lens heating sensitivity map; and when the imaging and lens heating performance is unsatisfactory, modifying the source mask and/or illumination source and increasing the imaging and lens heating performance. Modifying the source mask and/or illumination source can be performed according to at least one of the first, second and third embodiments, as detailed above.

These and other objectives of the present invention will no doubt become obvious to those of ordinary skill in the art after reading the following detailed description of the preferred embodiment that is illustrated in the various figures and drawings.

DETAILED DESCRIPTION

The embodiments outline various techniques that work to reduce and potentially cancel out the effects of lens heating without substantially affecting the imaging performance. A number of embodiments are detailed herein and are described with reference to the accompanying drawings.

The embodiments may change the heat signature without substantially affecting imaging performance. As described in the above, light that falls outside the pupil-stop might not affect the imaging. The present embodiment uses this fact to design and manipulate the heat signatures to reduce the effect of lens distortion. The lens response upon heat load can be experimentally measured or predicted by modeling. Once the lens response is known, the heat load signature of a certain design can be purposely altered to reduce the lens heating response.

First, a lens heating sensitivity map is built to determine the sensitive areas of the lens. This can be done using various methods, but one example is to heat different portions of the lens and measure the resultant wavefront aberrations. As detailed above, the aberrations can be described by Zernike polynomials. Finding Zernike solutions using heat load locations allows a lens heating sensitivity map to be built, which shows the lens heating 'hotspots'.

When a laser (for example) is projected through the pupil of the lens, the energy of the laser may affect the lens temperature. Any light (energy) that is inside the pupil-stop may be projected onto a wafer, whereas any energy that is outside the pupil-fill area might not affect the imaging but may contribute to the lens distortion. Both positive and negative aberrations can be generated upon heat load. A neutral lens response is advantageous and both the positive and negative responses may have an undesired effect on the lens distortion. The areas of highest intensity light that heat the lens are called poles. By solving the Zernike polynomials, it can be predicted in what way these poles heat the lens, and what resultant wavefront aberrations may be produced. As both positive and negative responses have an effect on the lens shape, the lens heating (LH) sensitivity map is determined up to a position on the pupil where heat load does not measurably affect lens performance any more.

Figure 1:
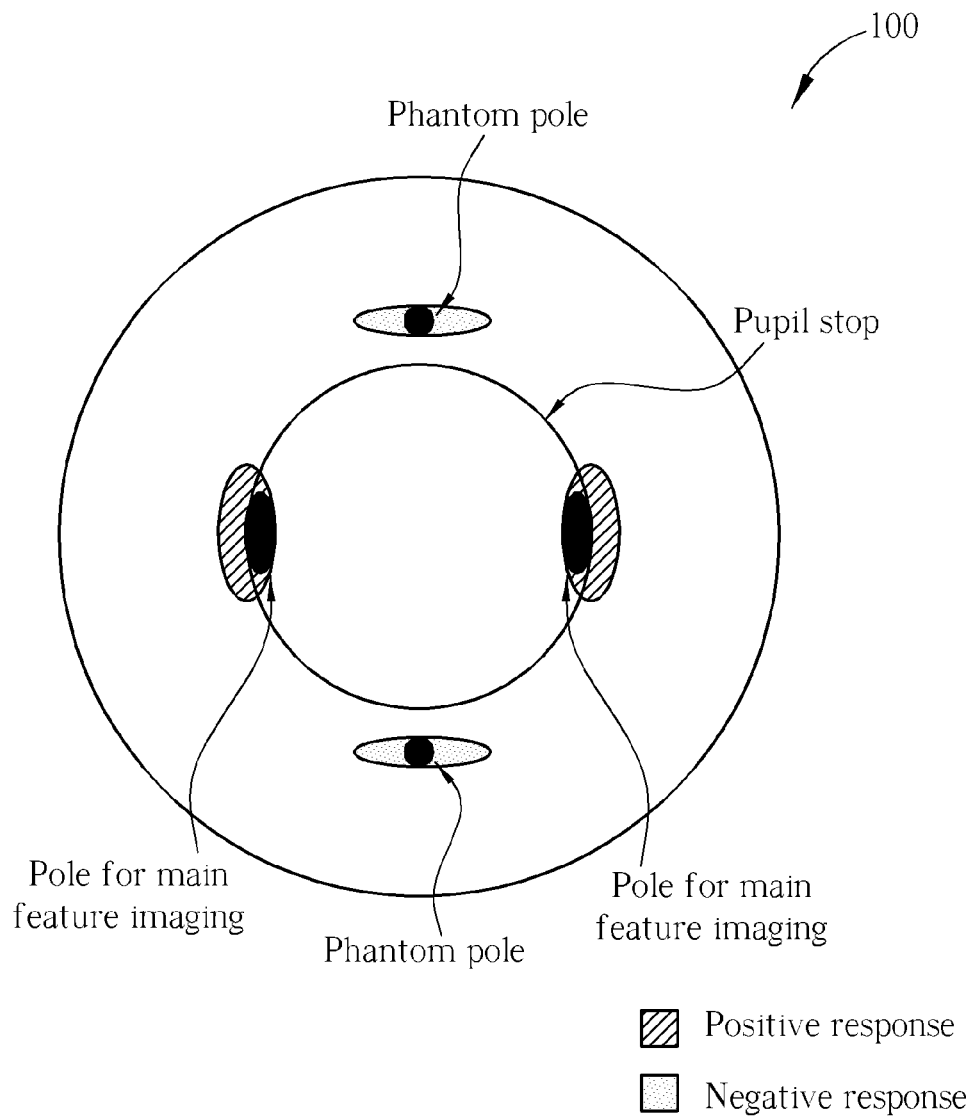
FIG. 1 is a diagram illustrating a method for reducing the effects of lens heating according to a first embodiment.

Reference to FIG. 1 shows a diagram of a method of solving the wavefront aberrations according to a first embodiment. The lens heating responses are shown in the diagram, where there are both positive and negative responses. The four oval shaped areas surrounding the lens represent these. As the poles for imaging generate diffraction patterns that overlap with the sensitive areas of the lens, this embodiment generates phantom poles, which in turn generate diffraction patterns that overlap with other sensitive areas of the lens to reduce and potentially cancel the lens heating effect. As shown in the diagram, these phantom poles are outside the pupil-stop; therefore, the energy created by them does not influence the imaging process. The lens heating sensitivity map is used to determine the exact placement of the poles.

Figure 2:
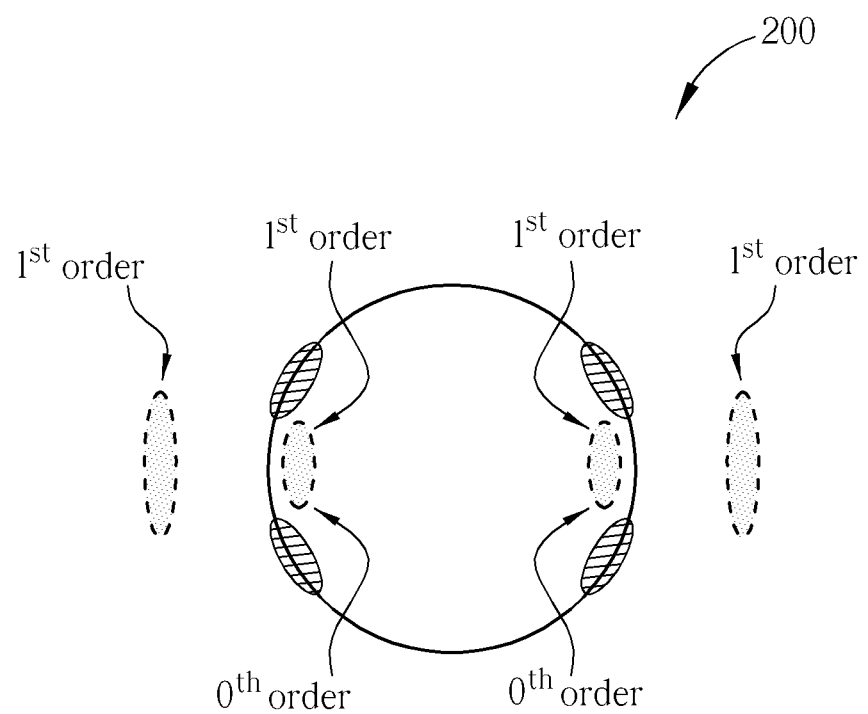
FIG. 2 is a diagram illustrating a method for reducing the effects of lens heating according to a second embodiment.

Reference to FIG. 2 shows a second embodiment. This embodiment uses the fact that, for dipole illumination, the heated areas vary depending on the shape of the pole. As the dipole illumination is not symmetric, part of the first order heat load could be concentrated on areas that have a large lens heating response. These areas are usually close to the pupil.

Rather than trying to cancel out the effects, the second embodiment changes the illumination source to reduce the effect of higher order diffraction patterns. One example is to use a tiger eye illumination, as illustrated in FIG. 2. The four oval shaped areas that overlap the pupil-fill area are the most sensitive parts of the lens. As a tiger-eye illumination has good symmetricity, the main illumination falls outside the sensitive parts. This is shown in the diagram, where the $0^{th}$ order areas are concentrated inside the pupil-fill area, so all this energy can be used for wafer imaging, but might not contact the areas of the lens most sensitive to heat. The $1^{st}$ order periodicities largely overlap the $0^{th}$ order periodicities rather than contacting the sensitive areas of the lens.

Figure 3:
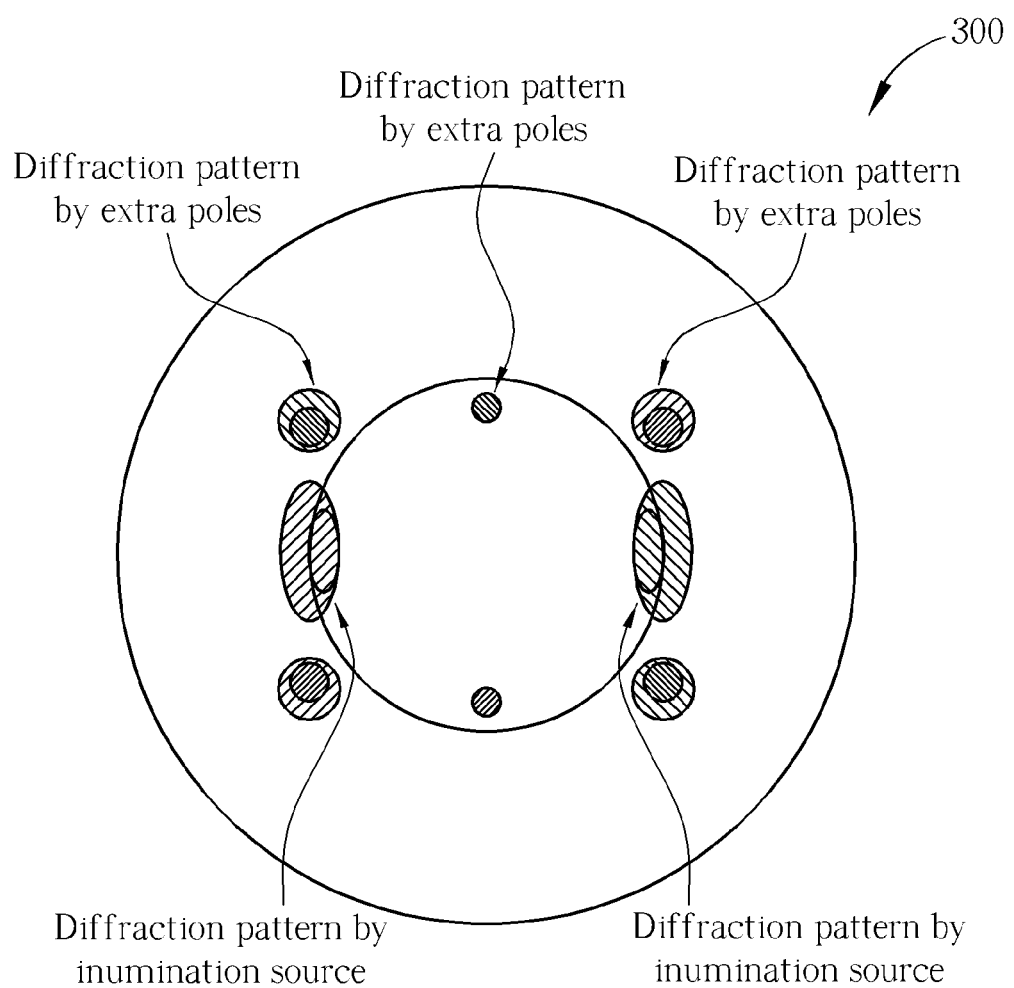
FIG. 3 is a diagram illustrating a method for reducing the effects of lens heating according to a third embodiment.

In some cases, it is acceptable to generate some extra energy into the pupil, as long as the effects are insubstantial. Reference to FIG. 3 illustrates a third embodiment. It is assumed the main feature generates a "positive" lens heating response. This embodiment utilizes the addition of extra poles for reducing or potentially cancelling out the wavefront aberrations caused by the main feature. Although these extra poles are inside the pupil, they might not affect the imaging performance depending on their location. By using the generated LH sensitivity map, they can be placed in an area inside the pupil where they reduce the lens heating response effectively while not having a significant effect on imaging performance.

As shown in FIG. 3, the extra poles create diffraction patterns that fall on negative LH response areas of the LH sensitivity map. Due to the opposite lens response generated by these extra poles, these diffraction patterns together with the diffraction patterns created by the original poles generate a reduced lens heating response. The extra poles are designed so that the $1^{st}$ order diffraction pattern is outside or inside the pupil area with the desired opposite lens heating response. The number of extra poles is not limited to those shown in the diagram.

Figure 4:
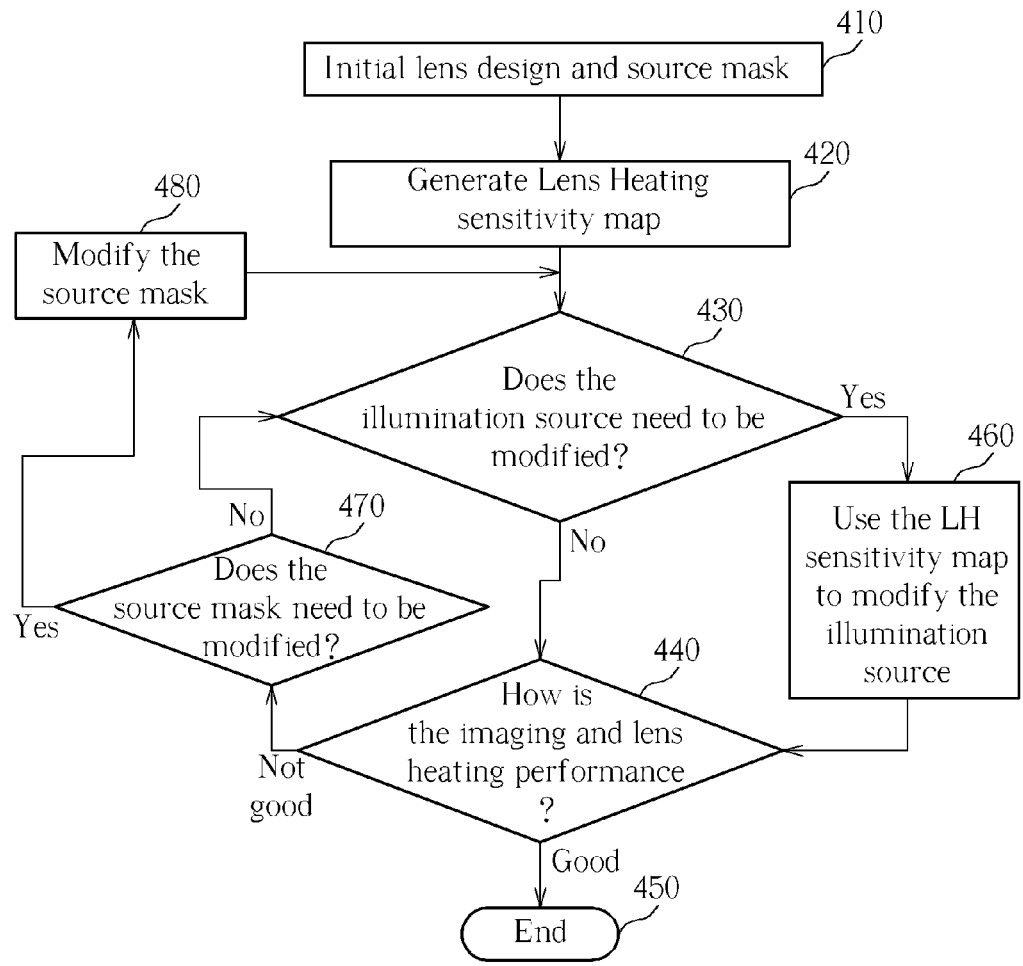
FIG. 4 is a flowchart of a method for reducing the effects of lens heating according to a fourth embodiment.

As mentioned previously, in lithographic projection, light is projected through a photo mask. As the present embodiment generates a lens heating sensitivity map using Zernike polynomials and heat load locations, this LH sensitivity map can be used in conjunction with the source mask optimization to ensure optimal performance. Reference to FIG. 4 shows a flowchart of the proposed method. The order of the steps as presented does not need to be contiguous; that is, other steps can be inserted. The steps of the flowchart are as follows:

Step 410: Initial lens design and source mask design;
Step 420: Generate lens heating sensitivity map;
Step 430: Does the illumination source need to be modified? If yes, go to Step 460; if no, go to Step 440;
Step 440: How is the imaging and lens heating performance? If good, proceed to Step 450; if not good, go to Step 470;
Step 450: End the source mask optimization process;
Step 460: Use the LH sensitivity map to modify the illumination source. Proceed to Step 440;
Step 470: Does the source mask need to be modified? If yes, go to Step 480; if no, return to Step 430;
Step 480: Modify the source mask and return to Step 430;

As shown in FIG. 4, in Step 410 an initial source mask design is proposed. Using this initial design, a lens heating sensitivity map is generated in Step 420. In Step 430, a decision is made whether to modify the illumination source. If the manufacturer determines to perform this step, in Step 460 the lens heating sensitivity map is used to modify the illumination source, utilizing at least one of the methods detailed above in embodiments 1~3. In Step 440, the imaging and lens heating performance is evaluated. If the performance is good, the process can end (Step 450). If the performance is not satisfactory, the flow proceeds to Step 470, where a decision is made whether to modify the source mask. If the source mask is modified (Step 480), then the flow returns to Step 430. If the source mask is not modified, the flow also returns to Step 430, where a decision to modify the illumination source can again be made. In this way, the source mask and/or the illumination source may be modified in order to achieve satisfactory imaging performance and reduce the lens heating. There may be a time versus performance trade-off; in practice, this method is best used for low K value imaging. Therefore, using the LH map, a manufacturer can elect whether or not to alter the poles, change the source mask, or use a combination of the two methods.

The above-described methods provide solutions to mitigate lens heating effects, by solving for Zernike polynomials and using heat load locations to generate a lens heating Sensitivity map, and then adding extra poles/phantom poles/changing the illumination source in order to compensate for the effects of lens heating without adding substantially more energy in the pupil area. Even in cases where some energy falls inside the pupil area, as in the third embodiment, the effect of this extra energy on the imaging performance may be insubstantial, as the manufacturer can put the poles in areas where they might not have a significant effect on the imaging performance. In addition, the above methods can be utilized in combination with a source mask optimization procedure for achieving satisfactory imaging results.

Those skilled in the art will readily observe that numerous modifications and alterations of the device and method may be made while retaining the teachings of the invention.

What is claimed is:

1. A method for increasing image performance of a lens used in an imaging procedure, comprising:
    selecting a source mask to be used in the imaging procedure;
    determining heat load locations on the entire lens according to an illumination source and a reticle design;
    obtaining a lens response characterization of the entire lens according to the heat load locations;
    utilizing the heat load locations and the lens response characterization to generate a lens heating sensitivity map for the entire lens;
    determining an imaging and lens heating performance according to the lens heating sensitivity map by defining positive and negative aberrations; and
    when the imaging and lens heating performance is unsatisfactory, modifying the source mask and/or illumination source so that the positive and negative aberrations balance out to give a neutral lens response and increase the imaging and lens heating performance.

2. The method of claim 1, wherein obtaining the lens response characterization comprises solving at least a Zernike polynomial, the solved Zernike polynomial being utilized with the heat load locations to generate the lens heating sensitivity map for the entire lens.

3. The method of claim 1, wherein modifying the source mask and/or illumination source comprises:
    utilizing the heat sensitivity map to alter the shape of the illumination source to affect the positive and negative lens responses.

4. The method of claim 1, wherein modifying the source mask and/or illumination source comprises:
    utilizing the lens heating sensitivity map to place at least an extra pole in a specific location of the lens.

5. The method of claim 4, wherein the extra pole is inside a pupil-stop area of the lens.

6. The method of claim 4, wherein the extra pole is outside a pupil-stop area of the lens.

* * * * *